United States Patent
Chan et al.

(10) Patent No.: US 12,439,642 B2
(45) Date of Patent: Oct. 7, 2025

(54) SEAM-TOP SEAL FOR DIELECTRICS

(71) Applicant: Taiwan Semiconductor Manufacturing Company, Ltd., Hsinchu (TW)

(72) Inventors: Kuei-Lin Chan, Hsinchu (TW); Fu-Ting Yen, Hsinchu (TW); Yu-Yun Peng, Hsinchu (TW); Keng-Chu Lin, Ping-Tung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 477 days.

(21) Appl. No.: 17/833,803

(22) Filed: Jun. 6, 2022

(65) Prior Publication Data

US 2023/0395683 A1    Dec. 7, 2023

(51) Int. Cl.

| | |
|---|---|
| *H10D 30/67* | (2025.01) |
| *H01L 21/02* | (2006.01) |
| *H01L 21/306* | (2006.01) |
| *H10D 30/01* | (2025.01) |
| *H10D 62/10* | (2025.01) |

(52) U.S. Cl.
CPC ..... *H10D 30/6735* (2025.01); *H01L 21/0226* (2013.01); *H01L 21/30604* (2013.01); *H10D 30/024* (2025.01); *H10D 30/6748* (2025.01); *H10D 62/119* (2025.01)

(58) Field of Classification Search
CPC .......... H10D 30/6735; H10D 30/024; H10D 30/6748; H10D 62/119; H01L 21/0226; H01L 21/30604; H01L 21/02126; H01L 21/0234; H01L 21/02359; H01L 21/31111; H01L 21/0228; B82Y 10/00
See application file for complete search history.

(56) References Cited

U.S. PATENT DOCUMENTS

| | | |
|---|---|---|
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,564,489 B2 | 2/2017 | Yeo et al. |
| 9,576,814 B2 | 2/2017 | Wu et al. |
| 9,601,342 B2 | 3/2017 | Lee et al. |

(Continued)

FOREIGN PATENT DOCUMENTS

| | | |
|---|---|---|
| TW | 202109629 A | 3/2021 |
| TW | 202129840 A | 8/2021 |
| TW | 202137571 A | 10/2021 |

*Primary Examiner* — Yara B Green
*Assistant Examiner* — Akhee Sarker-Nag
(74) *Attorney, Agent, or Firm* — Sterne, Kessler, Goldstein &Fox P.L.L.C.

(57) ABSTRACT

A post-deposition treatment can be applied to an atomic layer deposition (ALD)-deposited film to seal one or more seams at the surface. The seam-top treatment can physically merge the two sides of the seam, so that the surface behaves as a continuous material to allow etching at a substantially uniform rate across the surface of the film. The seam-top treatment can be used to merge seams in ALD-deposited films within semiconductor structures, such as gate-all-around field effect transistors (GAAFETs).

20 Claims, 15 Drawing Sheets

(56) References Cited

U.S. PATENT DOCUMENTS

| | | |
|---|---|---|
| 9,608,116 B2 | 3/2017 | Ching et al. |
| 10,692,773 B2* | 6/2020 | Kao ..................... H10D 64/017 |
| 2004/0219789 A1* | 11/2004 | Wood ................ H01L 21/31116 |
| | | 257/E21.252 |
| 2019/0267463 A1* | 8/2019 | Chao ...................... H10D 30/62 |
| 2020/0161123 A1* | 5/2020 | Kao .................. H01L 21/02211 |
| 2021/0057525 A1 | 2/2021 | Chiang et al. |
| 2021/0242327 A1 | 8/2021 | Lin et al. |
| 2022/0359506 A1 | 11/2022 | Ng et al. |

\* cited by examiner

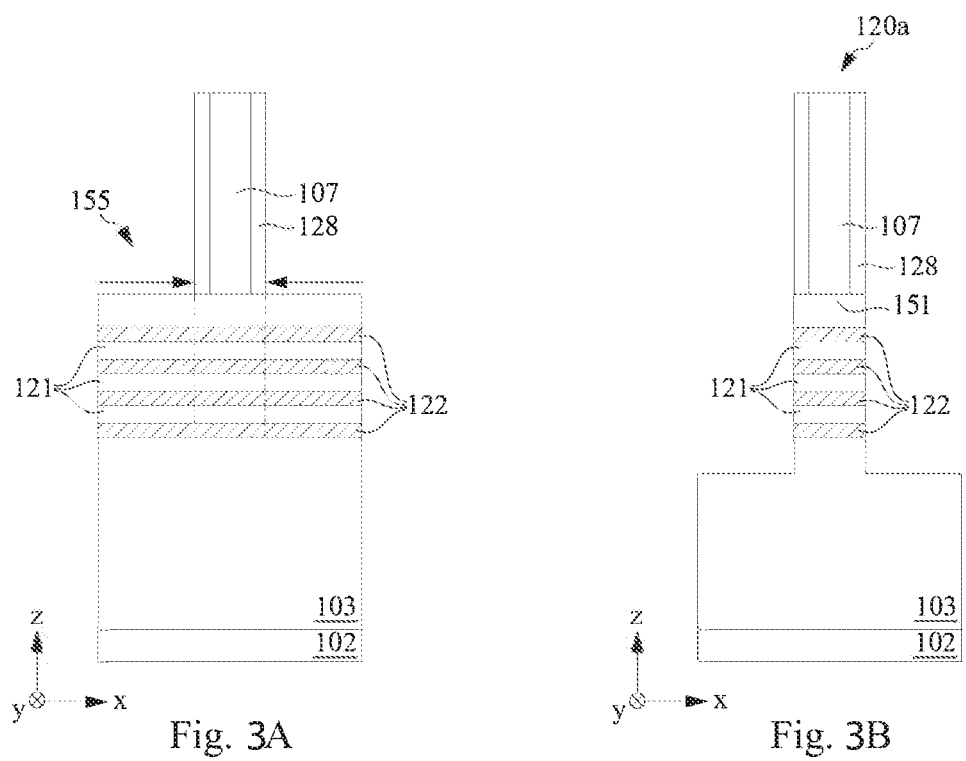

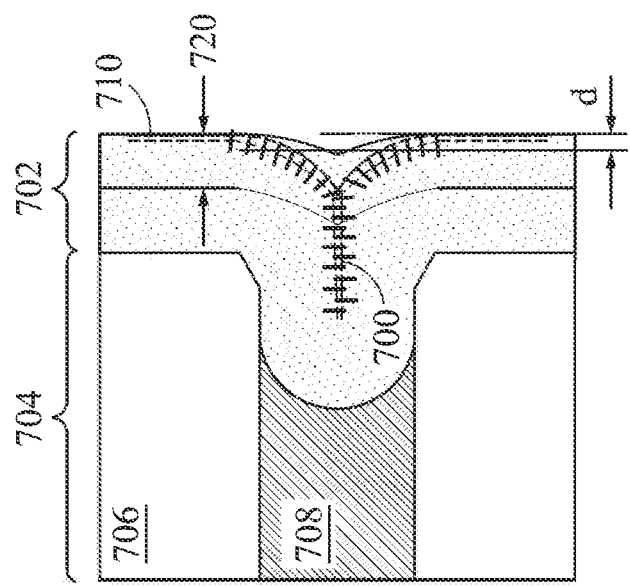
Fig. 10
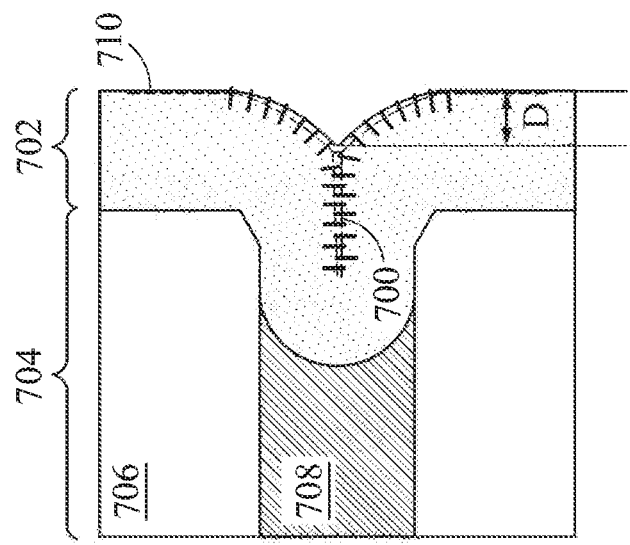
Fig. 9
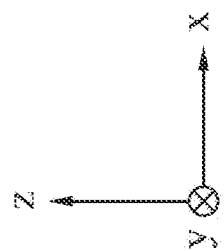

SEAM-TOP SEAL FOR DIELECTRICS

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (FinFETs), and gate-all-around field effect transistors (GAAFETs). Such scaling down has increased the complexity of semiconductor manufacturing processes. Dielectric materials that are used throughout the fabrication process can be challenging to deposit at small feature sizes.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

FIGS. 3A, 3B, 4A-4C, and 5 are isometric and cross-sectional views of GAAFETs at various stages of their fabrication process, in accordance with some embodiments of the present disclosure.

FIGS. 9 and 10 are cross-sectional views of an ALD-deposited dielectric film that has a seam, in accordance with some embodiments of the present disclosure.

DETAILED DESCRIPTION

Figure 1:
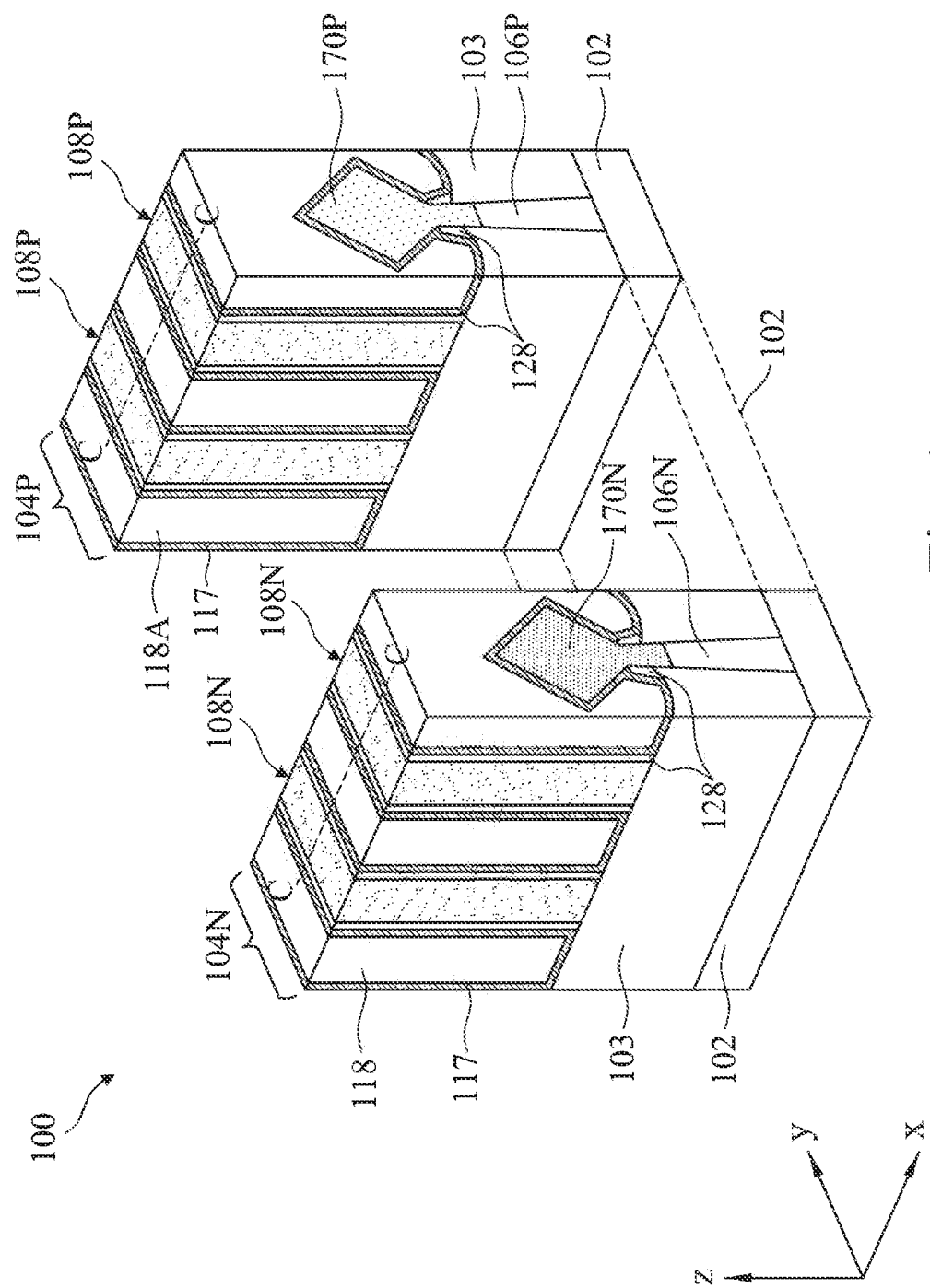
FIG. 1 is an isometric view of a pair of n-type GAAFETs and a pair of p-type GAAFETs, in accordance with some embodiments of the present disclosure.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

In some embodiments of the present disclosure, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

The term "vertical," as used herein, means nominally perpendicular to the surface of a substrate.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

Various deposition methods can be used to deposit films on a semiconductor substrate during fabrication of integrated circuits (ICs). One deposition method that can be used is atomic layer deposition (ALD), which can be used to deposit dielectric materials in front end processing of transistors, including 2-D MOSFETs, FinFETs, and gate-all-around FETs, or GAAFETs. Front end dielectric films can include, for example, spacers in the transistor gate structure. Examples of dielectric materials that can be deposited-using a deposition method, such as ALD-include silicon dioxide ($SiO_2$) and dielectrics with a low dielectric constant k (e.g., a material with a dielectric constant less than about 3.9 or "low-k" dielectric material). Low-k dielectric materials include fluorosilicate glass, carbon-doped silicon dioxide (SiOC), and carbon-doped silicon oxynitride (SiOCN). While depositing dielectric materials, such as those deposited using ALD, a seam may be formed at the surface of the dielectric film. In subsequent processing operations that involve etching the deposited dielectric, material in proximity to the seam may etch faster than other portions of the dielectric material.

A post-deposition treatment as described herein can be applied to the dielectric film to seal one or more seams at the dielectric material's surface, according to some embodiments of the present disclosure. This process of sealing the one or more seams is also referred to herein as "a seam-top treatment." The seam-top treatment can physically merge two sides of the seam to form a substantially planar surface for the dielectric material, thus allowing etching at a substantially uniform rate across the dielectric material's surface.

Figure 5:
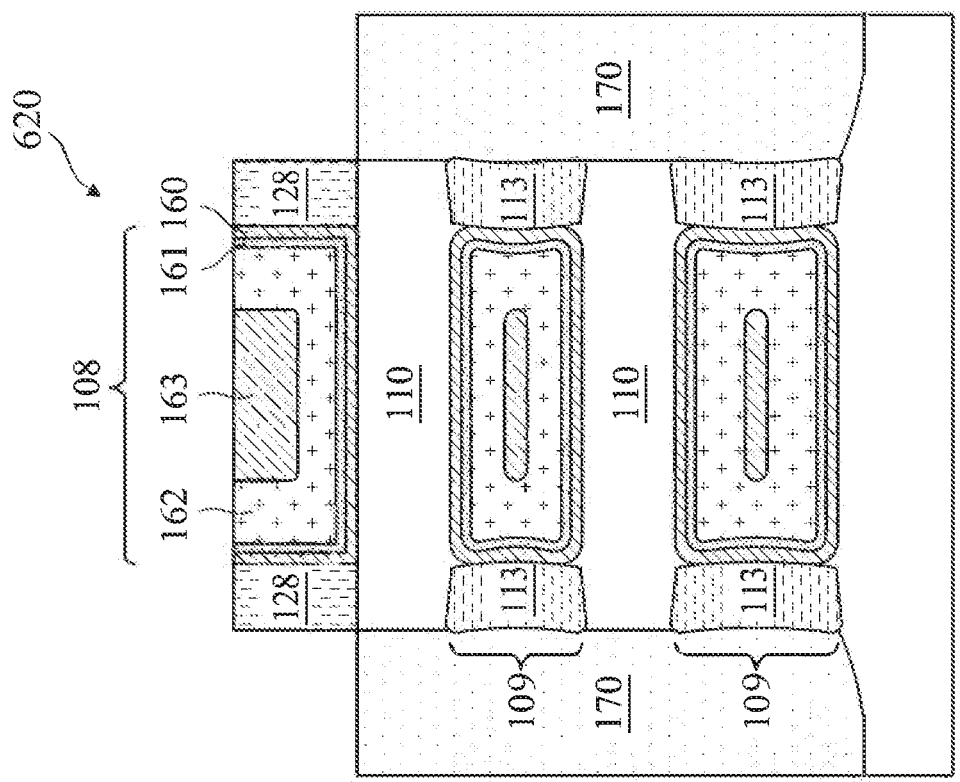

FIG. 1 illustrates an isometric view of a semiconductor device 100 that includes a pair of n-type transistors (NFETs) 104N and a pair of p-type transistors (PFETs) 104P, according to some embodiments of the present disclosure. The discussion of elements of NFET 104N and PFET 104P with the same annotations applies to each other, unless mentioned otherwise. In the examples shown in FIG. 1, NFET 104N and PFET 104P are GAAFETs with epitaxial source/drain regions 170N and 170P that have diamond or hexagonal shapes, which should not be interpreted as limiting. For example, alternative structures can include nanosheet GAAFETs having 2-D channels or nanowire GAAFETs having 1-D channels. GAAFETs 104N and 104P can include various spacers made of dielectric materials that can be deposited using, for example, an ALD process. Such spacers are shown in FIG. 5.

GAAFETs 104N and 104P include gate structures 108 that wrap around sides of one or more current-carrying channels 110. When a voltage applied to gate structure 108 exceeds a certain threshold voltage, GAAFETs 104N and 104P switch on and current flows through channels 110. When the applied voltage drops below the threshold voltage, GAAFETs 104N and 104P shut off and current ceases to flow through channels 110. Because the wrap-around arrangement of gate structure 108 influences channels 110 from its sides, improved control of the conduction properties of channels 110 is achieved in GAAFETs 104N and 104P compared with other transistor structures. In some embodiments of the present disclosure, gate structure 108 in GAAFETs 104N and 104P can be made of polysilicon. In some embodiments of the present disclosure, gate structure 108 can be made of metal, which can be fabricated by first forming a sacrificial polysilicon gate structure and later replacing the sacrificial polysilicon structure with a metal gate.

GAAFETs 104N and 104P are formed on a substrate 102. In some embodiments of the present disclosure, substrate 102 is common to multiple devices and/or a plurality of device types. As used herein, the term "substrate" describes a material onto which subsequent material layers are added. Substrate 102 can include one or more of a wide array of semiconductor materials, such as silicon, germanium, gallium arsenide, and indium phosphide. Alternatively, substrate 102 can be made from an electrically non-conductive material, such as a glass wafer or a sapphire wafer. Substrate 102 can be patterned, for example, to form shallow trench isolation (STI) regions 103 in substrate 102 to electrically isolate neighboring GAAFETs from one another. In some embodiments of the present disclosure, the insulating material for STI regions 103 can include, for example, silicon dioxide ($SiO_2$), silicon nitride (SiN), silicon oxynitride (SiON), fluoride-doped silicate glass (FSG), or a low-k dielectric material. In some embodiments of the present disclosure, the insulating material for STI regions 103 can be deposited using a flowable chemical vapor deposition (FCVD) process, a high-density-plasma (HDP) CVD process, or a plasma enhanced (PE) CVD process.

Semiconductor device 100 can further include gate sidewall spacers 128, shallow trench isolation (STI) regions 103, etch stop layers (ESLs) 117, and interlayer dielectric (ILD) layers 118. ILD layer 118 can be disposed on ESL 117. ESL 117 can be configured to protect gate structures 108N and 108P and/or S/D regions 170N and 170P. In some embodiments, gate sidewall spacers 128, STI regions 103, ESLs 117, and ILD layers 118 can include an insulating material, such as silicon oxide, silicon nitride (SiN), silicon carbon nitride (SiCN), silicon oxycarbon nitride (SiOCN), and silicon germanium oxide.

Semiconductor device 100 can be formed on a substrate 102 with NFET 104N and PFET 104P formed on different regions of substrate 102. There may be other FETs and/or structures (e.g., isolation structures) formed between NFET 104N and PFET 104P on substrate 102. Substrate 102 can be a semiconductor material, such as silicon, germanium (Ge), silicon germanium (SiGe), a silicon-on-insulator (SOI) structure, and a combination thereof. Further, substrate 102 can be doped with p-type dopants (e.g., boron, indium, aluminum, or gallium) or n-type dopants (e.g., phosphorus or arsenic). In some embodiments, fin structures 106N-106P can include a material similar to substrate 102 and extend along an X-axis.

Referring to FIG. 1, NFET-PFET 104N-104P can include stacks of nanostructured channels 110, gate structures 108N-108P, S/D regions 170N-170P, and S/D contact structures 120N-120P disposed on S/D regions 170N-170P.

Figure 2:
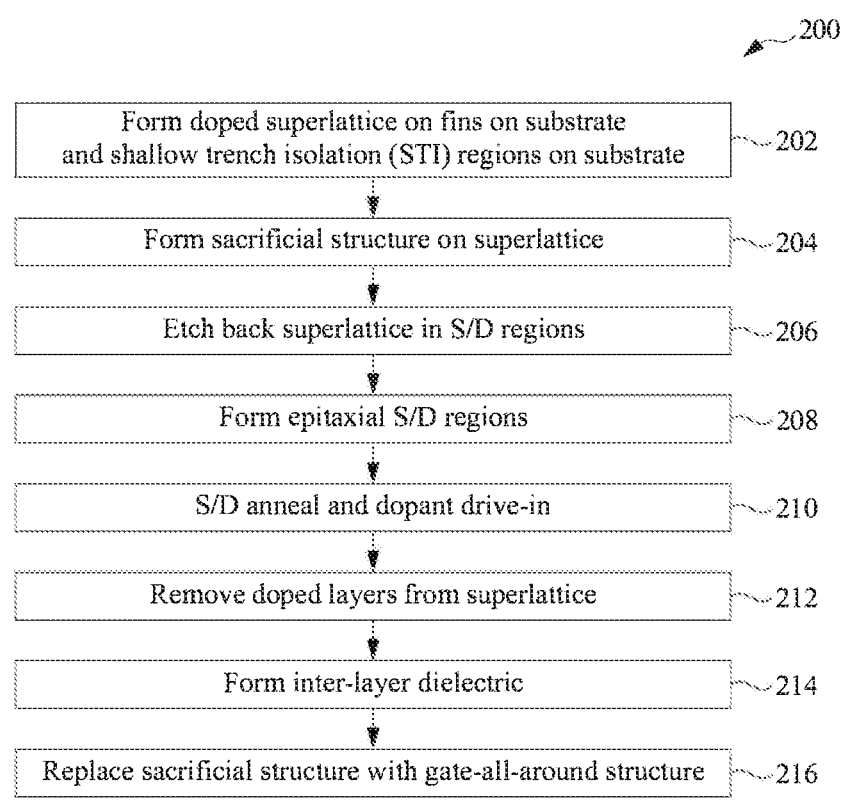
FIG. 2 is a flow diagram of a method for fabricating GAAFETs, in accordance with some embodiments of the present disclosure.

Referring to FIGS. 1 and 5, NFET 104N can include an array of gate structures 108N disposed on fin structure 106N, and PFET 104P can include an array of gate structures 108P disposed on fin structure 106P. NFET 104N can further include stacks of nanostructured channels 110 surrounded by gate structures 108N and an array of S/D regions 170N (one of S/D regions 170N shown in FIG. 1) disposed on portions of fin structure 106N that are not covered by gate structures 108N. Similarly, PFET 104P can further include stacks of nanostructured channels 110 surrounded by gate structures 108P and an array of epitaxial S/D regions 170P (one of S/D regions 170P shown in FIG. 2) disposed on portions of fin structure 106P that are not covered by gate structures 108P. FIG. 2 shows S/D regions 170, which represent either S/D region 170N or S/D region 170P. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm.

FIG. 2 is a flow diagram of a method 200 for fabricating the exemplary semiconductor device 100 shown in FIG. 1, according to some embodiments. For illustrative purposes, operations illustrated in FIG. 2 will be described with reference to the exemplary process for fabricating semiconductor device 100, as illustrated in FIGS. 3A-3B, 4A-4C, and 5, which are isometric and cross-sectional views of semiconductor device 100 at various stages of its fabrication, according to some embodiments.

Operations of method 200 can be performed in a different order, or not performed, depending on specific applications. It is noted that method 200 may not produce a complete semiconductor device. Accordingly, it is understood that additional processes can be provided before, during, or after method 200, and that some of these additional processes may only be briefly described herein.

In operation 202, superlattice structures are formed on fin structures, which are formed on a substrate. For example, as shown FIGS. 3A-3B, superlattice 155 is formed on fin structures, e.g., fins 151, on substrate 102. FIG. 3A illustrates a cross-sectional view of substrate 102 after formation of superlattice 155. FIG. 3B illustrates a cross-sectional view of substrate 102 after superlattice 155 has been patterned to form fins 151 and after formation of STI regions 103.

Referring to FIGS. 3A and 3B, superlattice 155 can include a stack of nanostructured layers 121 and 122 arranged in an alternating configuration. In some embodiments, nanostructured layers 121 include materials similar to one another, e.g., epitaxial Si, and doped nanostructured layers 122 include materials similar to one another, e.g., doped epitaxial SiGe. Superlattice 155 can include nanostructured layers 121-122 made of materials such as Si, SiGe, various alloys of silicon, germanium, and boron (e.g., SiGeB, GeB, and SiGeSnB), silicon arsenide (SiAs), silicon phosphide (SiP), silicon carbide (SiC), silicon carbon phosphide (SiCP), and combinations thereof.

In some embodiments, superlattice 155 is formed by etching a stack of two different semiconductor layers arranged in the alternating configuration. Doped nanostructured layers 122 are sacrificial; that is, they are replaced in subsequent processing, while nanostructured layers 121 remain as part of semiconductor devices 100. Although FIGS. 3A-3B show three nanostructured layers 121 and four doped nanostructured layers 122, any number of nanostructured layers can be included in each superlattice 155. The alternating configuration of superlattice 155 can be achieved by alternating deposition, or epitaxial growth, of SiGe and Si layers, starting from the top silicon layer of substrate 102. Etching the Si layers can form nanostructured layers 121, which are interleaved with SiGe doped nanostructured layers 122. In some embodiments, each of the nanostructured layers 121-122 may have thicknesses between about 3 nm and about 10 nm. In some embodiments, the topmost nanostructured layers (e.g., Si layers) of superlattice 155 may be thicker than the underlying nanostructured layers. Though rectangular cross-sections of nanostructured channel layers 121 are shown, channel layers 121 and/or doped nanostructured layers 122 can have cross-sections of other geometric shapes (e.g., circular, elliptical, triangular, or polygonal).

Superlattice 155, as a multi-layer stack of two different semiconductor materials, can be formed via an epitaxial growth process. The epitaxial growth process can include (i) chemical vapor deposition (CVD), such as low pressure CVD (LPCVD), rapid thermal chemical vapor deposition (RTCVD), metal-organic chemical vapor deposition (MOCVD), atomic layer CVD (ALCVD), ultrahigh vacuum CVD (UHVCVD), reduced pressure CVD (RPCVD), and other suitable CVD processes; (ii) molecular beam epitaxy (MBE) processes; (iii) other suitable epitaxial processes; or (iv) a combination thereof. In some embodiments, source/drain regions can be grown by an epitaxial deposition/partial etch process, which repeats the epitaxial deposition/partial etch process at least once. Such repeated deposition/partial etch process is also called a "cyclic deposition-etch (CDE) process." In some embodiments, source/drain regions can be grown by selective epitaxial growth (SEG), where an etching gas can be added to promote selective growth on exposed semiconductor surfaces of substrate 102 or the fin, but not on insulating material (e.g., dielectric material of STI regions 103).

Surface-doped GAA structures as disclosed herein can be made using doped nanostructured layers 122 that are formed by introducing dopants in-situ, during the epitaxial growth process as described above. In some embodiments, the dopant concentration in doped nanostructured layers 122 thus formed can be between about $1 \times 10^{12}$ cm$^{-3}$ and about $1 \times 10^{20}$ cm$^{-3}$.

Following the formation of superlattice 155, etching of the silicon substrate 102 can continue to form fins 151, as shown in FIG. 3B. In a GAAFET, fins 151 provide structural support for superlattice 155. The trenches around fins 151 are then filled with an insulating material to form STI regions 103, as shown in FIG. 3B. For example, STI regions 103 can be deposited and then etched back to a desired height. Insulating material in STI regions 103 can include, for example, a silicon oxide (SiO$_2$), silicon nitride (SiN), silicon oxynitride (SiON), fluoride-doped silicate glass (FSG), or a low-k dielectric material, and/or other suitable insulating material. In some embodiments, the term "low-k" refers to a low dielectric constant. In the field of semiconductor device structures and manufacturing processes, low-k refers to a dielectric constant that is less than the dielectric constant of SiO$_2$ (e.g., less than 3.9). In some embodiments, STI regions 103 can include a multi-layered structure. In some embodiments, the process of depositing the insulating material can include any deposition method suitable for flowable dielectric materials (e.g., flowable silicon oxide). For example, flowable silicon oxide can be deposited for STI regions 103 using a flowable CVD (FCVD) process. The FCVD process can be followed by a wet anneal process. In some embodiments, the process of depositing the insulating material can include depositing a low-k dielectric material to form a liner. In some embodiments, a liner made of another suitable insulating material can be placed between STI regions 103 and adjacent FETs. In some embodiments, STI regions 103 can be annealed.

Referring to FIG. 2, in operation 204, a sacrificial structure 107 is formed around superlattice 155, as shown in FIGS. 3A-3B. Sacrificial structure 107 includes a polysilicon layer and optionally, one or more sacrificial hard mask layers, omitted for simplicity. Sacrificial structure 107 can also include a sidewall spacer 128. To create sacrificial structure 107, a polysilicon layer can be deposited (e.g., by chemical vapor deposition (CVD) or plasma vapor deposition (PVD)), and then patterned using one or more hard mask layer(s), which can be retained during additional processing, or removed. Hard mask layers can be made of, for example, an oxide material or a silicon nitride (SiN) material that can be grown and/or deposited using an atomic layer deposition (ALD) process. In some embodiments, a hard mask used to pattern the polysilicon layer can be deposited by any suitable method and can be patterned using a photoresist mask. In some embodiments, a vertical (z-direction) dimension of sacrificial structure 107 can be about 90 nm to about 200 nm. Any number of sacrificial structures 107 can be formed substantially parallel to one another. Sidewall spacer 128 can be made of, for example, a silicon nitride (SiN) material that can be grown and/or deposited using an ALD process. In some embodiments, sidewall spacer 128 can include silicon oxide, silicon carbide, silicon oxy-nitride, a low-k material, or combinations thereof. Sacrificial structure 107 is replaced later in the fabrication process, at operation 216, by gate structure 108, which includes metal layers.

Referring to FIG. 2, in operation 206, superlattice 155 is removed in the source/drain regions so that nanostructured layers 121 and 122 remain under sacrificial structure 107, as shown in FIG. 3B. Removal of superlattice 155 in the source/drain regions can be accomplished using a mask to expose the source/drain regions, followed by an etch-back process using, for example, a diluted HF acid wet etch process. The HF acid can remove both silicon and SiGe nanostructured layers 121 and 122 outside the channel region, while the channel region is protected by hard mask and/or spacer layers of sacrificial structure 107. Such layers, if made of SiN, will not be etched by the HF acid. Alternatively, a dry etch process can be used to remove superlattice 155 in the source/drain regions. Superlattice 155 is then etched back, as indicated by arrows shown in FIG. 3A, so that the remaining portion of superlattice 155 is in a GAA channel region 620, underneath sacrificial structure 107, including sidewall spacer 128.

Figure 4A:
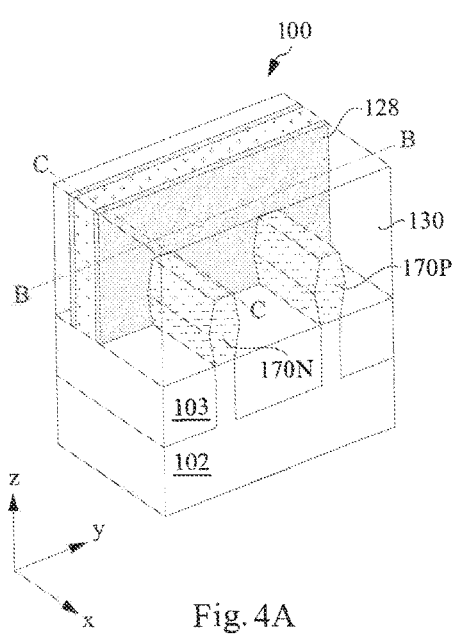
Figure 4B:
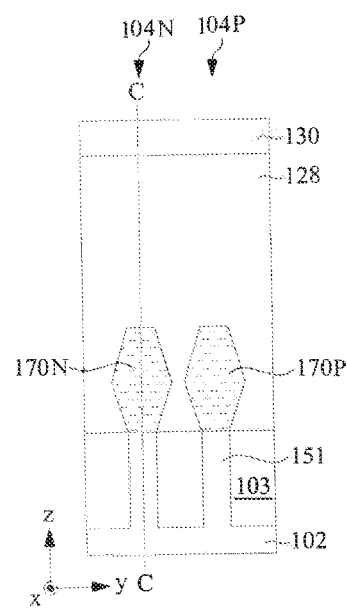

Referring to FIG. 2, in operation 208, epitaxial source/drain regions 170N and 170P are grown laterally outward, in the x-direction, from nanostructured layers 121 as shown in FIGS. 4A and 4B. Dopants can be introduced in-situ during the epitaxy process. In some embodiments, source/drain regions 170N and 170P can be annealed to drive in the dopants, in operation 210.

Referring to FIG. 2, in operation 212, inner spacers 113 are formed in GAA channel region 620 adjacent to doped nanostructured layers 122, which are then removed, as shown in FIG. 5. Nanostructured channels 110 remain in GAA channel region 620.

Referring to FIG. 5, in some embodiments, nanostructured channels 110 can include semiconductor materials similar to or different from substrate 102. In some embodiments, nanostructured channels 110 can include Si, SiAs, silicon phosphide (SiP), SiC, SiCP, SiGe, silicon germanium boron (SiGeB), germanium boron (GeB), silicon germanium stannum boron (SiGeSnB), a III-V semiconductor compound, or other suitable semiconductor materials. Though rectangular cross-sections of nanostructured channels 110 are shown, nanostructured channels 110 can have cross-sections of other geometric shapes (e.g., circular, elliptical, triangular, or polygonal).

In some embodiments, gate structures 108N-108P can be multi-layered structures and can surround each of nanostructured channels 110 for which gate structures 108N-108P can be referred to as "gate-all-around (GAA) structures" or "horizontal gate-all-around (HGAA) structures." NFET 104N can be referred to as "GAA FET 104N" or "GAA NFET 104N" and PFET 104P can be referred to as "GAA FET 104P" or "GAA PFET 104P." The portions of gate structures 108N-108P surrounding nanostructured channels 110 can be electrically isolated from adjacent S/D regions 170N-170P by inner spacers 113. Inner spacers 113 of GAAFETs 104N and 104P can include a material similar to gate sidewall spacers 128. In some embodiments, the vertical height of inner spacers 113 as shown in FIG. 2 can be about the same as the height of gate structures 108. Alternatively, inner spacers 113 can extend beyond the top and bottom surfaces of gate structures 108. In some embodiments, NFET-PFET 104N-104P can be finFETs and have fin regions (not shown) instead of nanostructured channels 110.

In some embodiments, each of gate structures 108N-108P can include multiple layers such as an interfacial oxide (IO) layer 160, a high-k (HK) gate dielectric layer 161 disposed on IO layer 160, a work function metal (WFM) layer 162 disposed on HK gate dielectric layer 161, and a metal gate electrode 163 disposed on WFM layer 162.

IO layers 160 can include silicon oxide ($SiO_2$), silicon germanium oxide ($SiGeO_x$), or germanium oxide ($GeO_x$). HK gate dielectric layers 161 can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). WFM layers 162 of gate structures 108N can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, a combination thereof, or other suitable Al-based materials. WFM layers 162 of gate structures 108P can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), and a combination thereof. Gate metal fill layers 163 can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof.

Figure 4C:
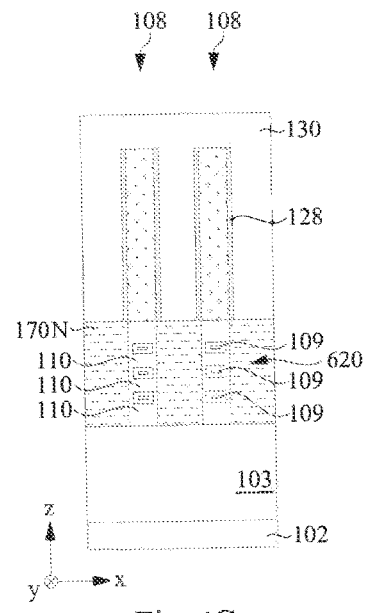

Referring to FIG. 2, in operation 214, inter-layer dielectric (ILD) 130 is deposited, as shown in FIGS. 4A-4C. FIGS. 4A-4C show an isometric view and cross-sectional views of a pair of GAAFETs following operation 214. ILD 130 is an insulating layer that electrically insulates neighboring devices and electrical contacts from one another. ILD 130 can be made of a silicon oxide, for example. ILD 130 can be deposited using a CVD or plasma enhanced CVD (PECVD) process, for example. FIG. 4B is a cross-sectional view of a pair of semiconductor devices 100 along cut line B-B, through the pair of fins with epitaxial source/drain regions 170. FIG. 4C is a cross-sectional view of a pair of semiconductor devices 100 along cut line C-C through the source/drain and gate.

Referring to FIG. 2, in operation 216, following the formation of ILD 130, sacrificial structure 107 is removed and replaced with gate structure 108 and gate-all-around structures 109, as shown in FIGS. 4A-4C and FIG. 5. FIGS. 4A-4C show isometric and cross-sectional views of semiconductor devices 100 following the replacement metal gate process, where sacrificial structures 107 have been replaced by metal gate structures 108, and nanostructured layers 122 have been replaced by GAA structures 109 in channel regions 620.

FIG. 5 is a magnified cross-sectional view of semiconductor device 100 along cut line C-C, corresponding to any of the GAAFETs shown. Cut line C-C cuts across the source, gate, and drain regions of GAAFETs 104N and 104P. FIG. 5 shows a GAA channel region 620 following a replacement metal gate process, in which gate structures 108 are formed together with gate-all-around structures 109, according to some embodiments. FIG. 5 shows details of an internal structure of the GAAFETs 104N and 104P underneath gate structure 108, including channels 110, gate sidewall spacers 128, and inner spacers 113. One or more of spacers 113 and 128 can be made of dielectric materials deposited using ALD.

In the replacement metal gate process, the sacrificial structure 107, e.g., a poly gate structure, can be removed using a dry etching process (e.g., plasma etching or reactive ion etching (RIE)) or a wet etching process. In some embodiments, gas etchants used in the dry etching process can include chlorine, fluorine, bromine (e.g., hydrogen bromide (HBr), oxygen (e.g., $O_2$ or $O_3$), or combinations thereof. In some embodiments, an ammonium hydroxide ($NH_4OH$), sodium hydroxide (NaOH), and/or potassium hydroxide (KOH) wet etch can be used to remove polysilicon sacrificial structures 107, or a dry etch followed by a wet etch process can be used.

Gate structure 108 is then grown in a multi-operation process to form a metal gate stack in place of sacrificial structure 107. Simultaneously, a radial gate stack is formed to fill gate openings in GAA channel region 620 from the outside in, starting with gate dielectric layer 160, and ending with gate electrode 163. Following the replacement metal gate process, GAA channel region 620 includes multiple GAA structures 109 (two shown in FIG. 5), which surround channels 110 to control current flow therein. Gate structure 108 has a width equal to the gate length $L_g$ of the GAAFET. In some embodiments, $L_g$ can be in the range of about 5 nm to about 20 nm.

Referring to the magnified view of GAA channel region 620 shown in FIG. 5, each GAA channel region 620 includes, from the outermost layer to the innermost layer, a bi-layer gate dielectric 160-161, a work function metal layer 162, and a gate electrode 163. Gate electrode 163 is operable to maintain a capacitive applied voltage across nanostructured channels 110. Inner spacers 113 electrically isolate GAA structure 109 from epitaxial source/drain regions 170N/170P and prevent current from leaking out of nanostructured channels 110. In some embodiments, inner spacers 113 can have a width from about 2 nm to about 8 nm. In some embodiments, GAA structures 109 can have a thickness from about 3 nm to about 15 nm. The bi-layer gate dielectric 160-161 separates metallic layers of GAA structure 109 from nanostructured channels 110. In some embodiments, an ALD process can be used to deposit one or more of radial gate stack layers 160-163.

The bi-layer gate dielectric may include a gate oxide inter-layer 160 and a high-k gate dielectric layer 161. In some embodiments, the bi-layer gate dielectric can have a total thickness between about 1 nm and about 5 nm. Gate oxide inter-layer 160 can include a silicon oxide, silicon nitride, and/or silicon oxynitride material, and may be formed by CVD, ALD, physical vapor deposition (PVD), e-beam evaporation, or other suitable deposition processes. High-k gate dielectric layer 161 includes a high-k material, where the term "high-k" refers to a high dielectric constant that exceeds the dielectric constant of $SiO_2$ (e.g., greater than 3.9). In some embodiments, the high-k dielectric material can be hafnium oxide ($HfO_2$). A high-k gate dielectric may be formed by ALD and/or other deposition methods.

Gate work function metal layer 162 can include a single metal layer or a stack of metal layers. The stack of metal layers can include metals having work functions similar to or different from each other. In some embodiments, gate work function metal layer 162 can include, for example, aluminum (Al), copper (Cu), tungsten (W), titanium (Ti), tantalum (Ta), cobalt (Co), metal nitrides, metal silicides, metal alloys, and/or combinations thereof. In some embodiments, gate work function metal layer 162 can be a bi-layer of titanium nitride (TiN) and a titanium-aluminum (TiAl) alloy. The gate work function metal layer can be formed using a suitable process, such as ALD, CVD, PVD, plating, and combinations thereof. In some embodiments, the gate work function metal layer can have a thickness between about 2 nm and about 15 nm.

Gate electrode 163 may further include a gate metal fill layer. The gate metal fill layer can include a single metal layer or a stack of metal layers. The stack of metal layers can include metals different from each other. In some embodiments, the gate metal fill layer can include one or more suitable conductive materials or alloys, such as Ti, Al, and TiN. The gate metal fill layer can be formed by ALD, PVD, CVD, or other suitable deposition process. Other materials, dimensions, and formation methods for the gate dielectrics 160-161, the gate work function metal layer 162, and the gate electrode 163 are within the scope and spirit of this disclosure.

FIGS. 1, 4C, and 5 illustrate examples of GAAFET structures that can include deposited dielectric films, in accordance with some embodiments of the present disclosure.

Figure 6:
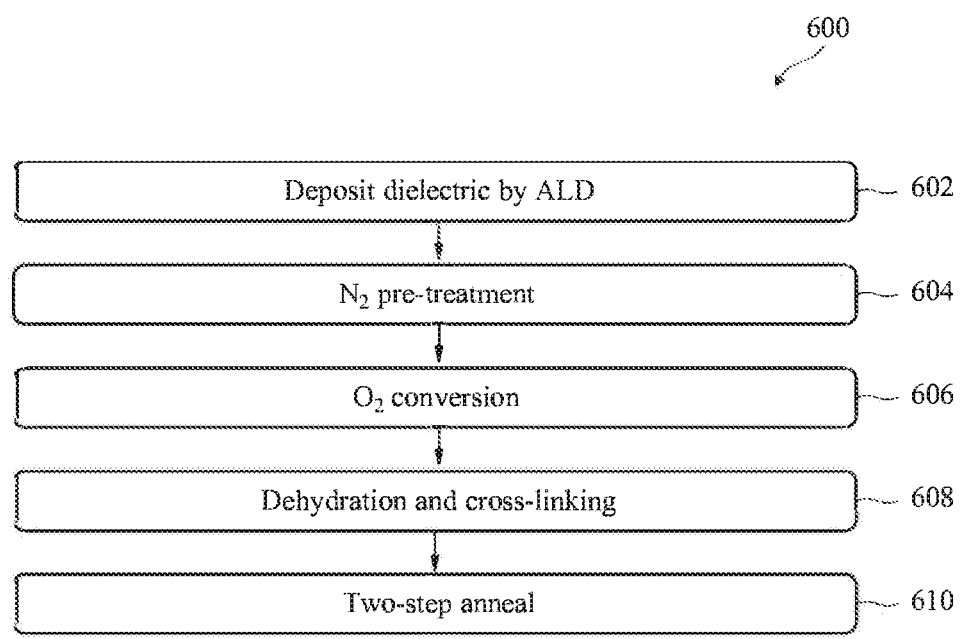
FIG. 6 is a flow diagram of a method for sealing a seam in an ALD-deposited dielectric film, in accordance with some embodiments of the present disclosure.

FIG. 6 illustrates a seam-sealing method 600 for forming and treating a dielectric layer formed by ALD, according to some embodiments of the present disclosure. Operations illustrated in FIG. 6 will be described with reference to processes for forming a dielectric layer and then post-treating the dielectric layer to seal a seam, as illustrated in FIGS. 4, 6, 7, 10A, 10B, 11A, 11B, 12, 13A, and 13B, which show structures at various stages of their fabrication, according to some embodiments of the present disclosure. Operations of seam-sealing method 600 can be performed in a different order, or not performed, depending on specific applications. It is noted that seam-sealing method 600 may not produce a completely seam-free dielectric layer. Accordingly, it is understood that additional processes can be provided before, during, or after seam-sealing method 600, and that some of these additional processes may be briefly described herein.

Figure 7:
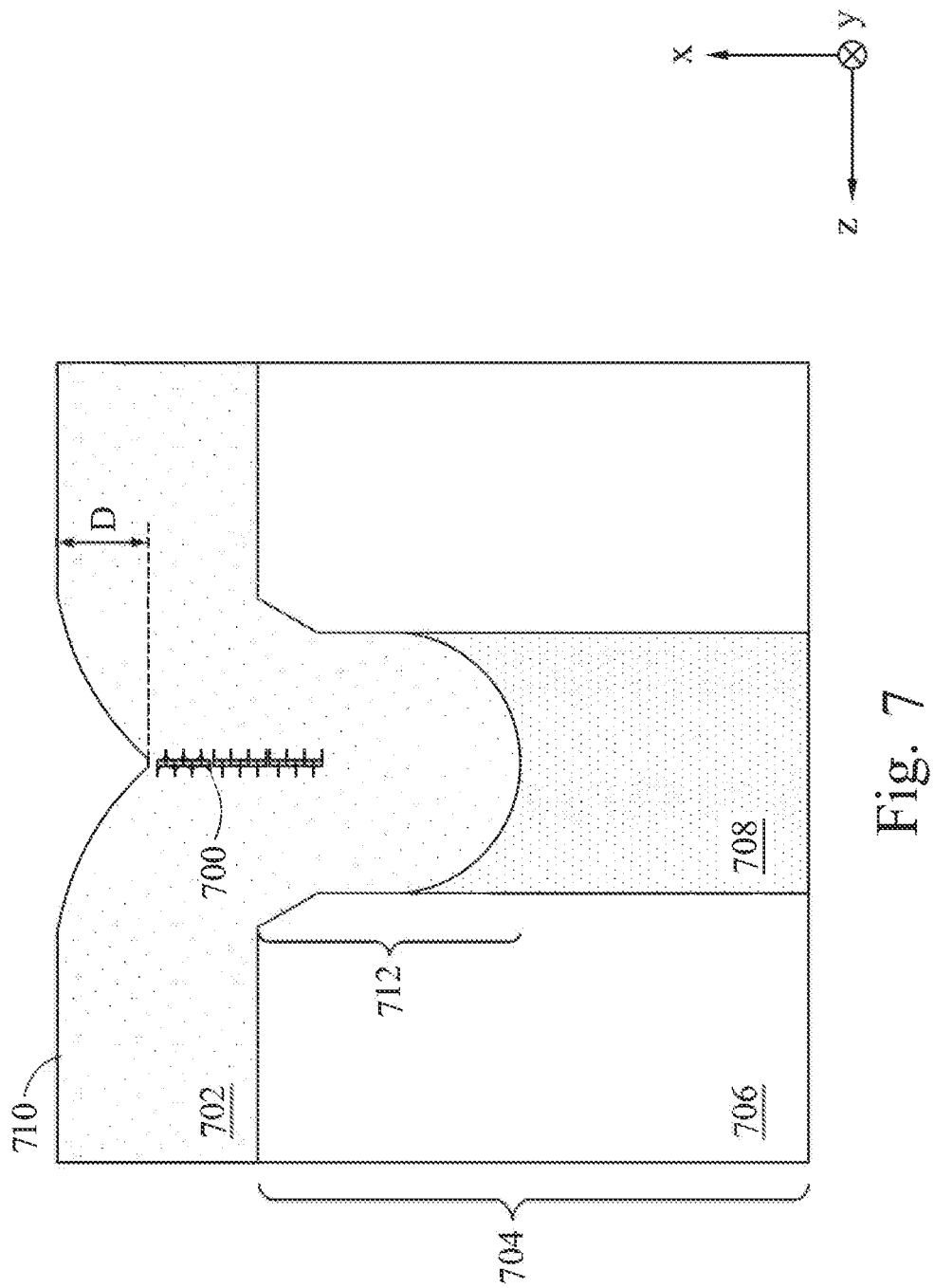
FIG. 7 is a cross-sectional view of an ALD-deposited dielectric film that has a seam, in accordance with some embodiments of the present disclosure.

Referring to FIG. 6, in operation 602, a dielectric material 702 is deposited onto a substrate 704 having an uneven surface. The dielectric material can be deposited by an ALD process. Referring to FIG. 7, a seam 700 can be created when a dielectric material 702 is conformally deposited by ALD on uneven underlying topography. One example where seam 700 may occur is during formation of inner spacers 113 in a GAAFET. Thus, in some embodiments, FIG. 7 can represent an enlarged and rotated view of the dielectric material that forms one of the inner spacers 113 shown in FIG. 5. In some embodiments of the present disclosure, dielectric material 702 has a composition characterized by a low dielectric constant and can be, for example, silicon oxy-carbon nitride (SiOCN). Other deposited materials-such as those materials deposited using ALD—can benefit from the treatment described herein. These other deposited materials include nitride-based dielectrics, such as silicon carbonitride (SiNC:H or SiCN:H), SiNCO:H, and oxide-based dielectrics such as hydrogenated silicon oxycarbide (SiOC:H or (SiCO:H), and silicon oxycarbonitride (SiONC:H or SiOCN:H).

In some embodiments of the present disclosure, substrate 704 includes a bulk layer 706 with a trench 708 formed therein. In some embodiments of the present disclosure, bulk layer 706 can be made of silicon or polysilicon, and trench 708 can be partially filled with one or more metals. In some embodiments of the present disclosure, bulk layer 706 can be a channel region of a silicon fin and dielectric material 702 can form inner spacer 113 on sidewalls of gate structure 109, as shown in FIG. 5. In some embodiments of the present disclosure, bulk layer 706 can be a channel region of a silicon fin, and dielectric material 702 can form sidewall spacer 128 on sidewalls of gate structure 109, as shown in FIGS. 4C and 5. In some embodiments of the present disclosure, trench 708 is a deep, narrow structure that can be a challenge to fill. Thus, trench 708 may be partially filled, and the top of trench 708 may have a recessed area 712.

Consequently, trench 708 may fail to present a flat surface for deposition of dielectric material 702. During deposition (e.g., an ALD process), dielectric material 702 enters recessed area 712 of trench 708 and completes the fill process, but creates seam 700 and associated dishing of depth D on a top surface 710 of dielectric material 702. In some embodiments of the present disclosure, the dishing can allow a concentration of etchant chemicals to accumulate during subsequent etching operations, which can accelerate the etch rate in the vicinity of seam 700. Operations in seam-sealing method 600 are directed to reducing the depth of surface dishing associated with seam 400 to create a more planar top surface 410 that will etch at a substantially constant rate across the top surface.

Figure 8A:
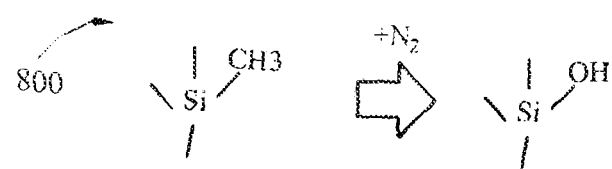
FIGS. 8A-8C are schematics of chemical reactions characterizing operations in the flow diagram shown in FIG. 6, in accordance with some embodiments of the present disclosure.

Referring to FIGS. 6 and 8A, in operation 604, a nitrogen pre-treatment 800 can be applied to as-deposited dielectric material 702, in accordance with some embodiments of the present disclosure. Nitrogen pre-treatment 800 can create additional dangling bonds at top surface 710, near seam 700 as shown in FIG. 8A. In some embodiments of the present disclosure, top surface 710 of dielectric material 702 has a surface molecular structure that includes methanide ($CH_3$) radicals bonded to silicon atoms. Nitrogen pre-treatment 800 exposes seam 700 to nitrogen to break the $CH_3$ bonds at the surface of dielectric material 702 and to convert the surface molecular structure of dielectric material 702 from $CH_3$ molecules to amino radicals ($NH_2$) and hydroxide (OH) dangling bonds, as illustrated by the pictorial chemical reaction shown in FIG. 8A. Sources of nitrogen used in nitrogen pre-treatment 800 can include nitrogen gas ($N_2$), ammonia ($NH_3$), $N_2$ plasma, nitrous oxide ($N_2O$) plasma, ammonia soaking, and combinations thereof. Sources of oxygen for the chemical reaction during nitrogen pre-treatment 800 include $N_2O$, if applied as a treatment, and oxygen within the bulk of dielectric material 702, e.g., in the form of SiOCN or SiOC. Nitrogen pre-treatment 500 can occur in a single wafer chamber, a furnace, or a rotary apparatus, at a pressure in the range of about 1 mTorr to about 2000 Torr. $N_2$ or $N_2O$ plasma treatment can be conducted in high-power microwave plasma chamber, or in an inductively coupled plasma (ICP) chamber.

In some embodiments of the present disclosure, nitrogen pre-treatment 800 can occur at temperatures in a range of about 150° C. to about 300° C. Varying the temperature of the nitrogen source can cause differences in treatment depth of dielectric material 702 and differences in composition within the treated region. Within the about 150° C. to about 300° C. temperature range, a corresponding treatment depth can range from about 1 nm to about 10 nm, depending on the dielectric. Variations in the desired etch selectivity modification of treated dielectric material 702 can result from temperature variations during nitrogen pre-treatment 800.

Figure 8B:
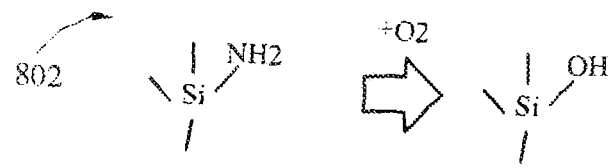

Referring to FIGS. 6 and 8B, in operation 606, an oxygen-conversion treatment 802 can be applied to pre-treated dielectric material 702, in accordance with some embodiments of the present disclosure. Oxygen-conversion treatment 802 can create additional dangling bonds at top surface 710, near seam 700 as shown in FIG. 8B. In some embodiments of the present disclosure, top surface 710 of dielectric material 702 includes NH2 molecules, e.g., following deposition operation 202 or enhanced by nitrogen pre-treatment 800. In some embodiments of the present disclosure, oxygen-conversion treatment 802 exposes seam 700 to oxygen to break the NH2 bonds and to convert the NH2 molecules to hydroxide (OH), as illustrated by the pictorial chemical reaction shown in FIG. 8B Sources of oxygen used in oxygen-conversion treatment 802 can include oxygen gas (O2), an O2 plasma, ozone (O3), water vapor (H2O), and combinations thereof. Exposure to such sources of oxygen can include chemical treatment, plasma treatment, and wet anneal. Oxygen-conversion treatment 802 can occur in a single wafer chamber, a furnace, or a rotary apparatus, at a pressure in the range of about 1 mTorr to about 2000 Torr. Oxygen-conversion treatment 802 using O2 plasma can be conducted in high-power microwave plasma chamber, or in an inductively coupled plasma (ICP) chamber.

In some embodiments of the present disclosure, oxygen conversion treatment 802 can occur at temperatures in a range of about 150° C. to about 700° C. Varying the temperature of the oxygen source can cause differences in treatment depth of dielectric material 702 and differences in composition within the treated region. Within the about 150° C. and about 700° C. temperature range, a corresponding treatment depth can vary from about 1 nm to about 100 nm, depending on the dielectric. Variations in the desired etch selectivity modification of treated dielectric material 702 can result from temperature variations during oxygen-conversion treatment 802. Oxygen-conversion treatment 802 can be a self-limiting treatment that continues as long as there exist reactant NH2 molecules at top surface 710.

Figure 8C:
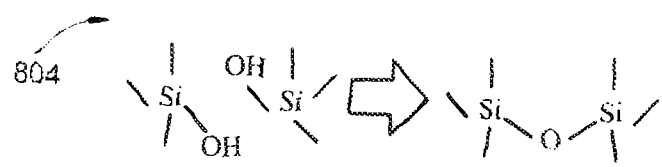

Referring to FIGS. 6 and 8C, in operation 608, a dehydration and cross-linking treatment 804 can be applied to pre-treated dielectric material 702, in accordance with some embodiments of the present disclosure. The effect of dehydration and cross-linking treatment 804 is to combine pairs of OH radicals and to remove a water molecule, leaving atomic oxygen as shown in FIG. 8C [[5C]]. The atomic oxygen can then cross-link adjacent silicon-based compounds at top surface 710. Dehydration and cross-linking treatment 804 is illustrated in the pictorial chemical reaction shown in FIG. 8C. Dehydration and cross-linking treatment 804 can be a self-limiting treatment that continues as long as there exist reactant OH radicals at top surface 710. For example, dehydration and cross-linking treatment 804 can be an annealing operation in an inert gas environment, e.g., Ar or N2, at a temperature in the range of about 300° C. to 800° C. for about 5 to about 8 hours. In some embodiments, dehydration and cross-linking treatment 804 can include curing with ultraviolet (UV) light. Dehydration and cross-linking treatment 804 therefore does not extend to, or affect, the bulk of dielectric material 702 [402]]. An effect of dehydration and cross-linking treatment 804 is to heal seam 700 by knitting together the two sides of the seam, or filling the seam. A result of filling seam 700 is that a seamless, or near seamless, top surface 710 will etch at substantially the same rate as the rest of dielectric material 702.

Referring to FIG. 6, in operation 610, an annealing treatment can be applied to cross-linked top surface 710, in accordance with some embodiments of the present disclosure. In some embodiments of the present disclosure, the annealing treatment can include one or both operations of a two-part anneal in which cross-linked top surface 710 is first exposed to $O_2$ gas at a pressure of about 1 Torr, in the temperature range of about 385° C. to about 400° C. for about 6 minutes, followed by exposure to $N_2$ gas at about 600° C. for about one hour. In some embodiments of the present disclosure, the annealing treatment can further include a UV cure operation at a temperature up to about 500° C. for a duration in the range of about 1 to about 60 minutes.

FIGS. 9 and 10 show how seam-sealing method 600 transforms top surface 710 with seam 700 and associated dishing depth D to treated top surface 710 with sealed seam 700 and reduced dishing depth d. FIG. 9 reproduces FIG. 7, rotated 90 degrees in a clockwise direction so as to represent an enlarged view of inner spacer 113 as shown in FIG. 5. FIG. 9 shows as-deposited dielectric material 702 for comparison with treated dielectric material 702 in FIG. 10. In some embodiments of the present disclosure, dehydration and cross-linking treatment 804 can affect a surface layer 720 of dielectric material 702. Within surface layer 720, the effect of seam-sealing method 600 is to reduce the dishing from depth D to a smaller depth d, associated with sealed seam 700. Thus, seam 700 is sealed via cross-linking of surface molecules, without a need to add more material. Surface bonds and low-k material within surface layer 720 can be analyzed using X-ray photoelectron spectroscopy (XPS), infrared spectroscopy (IR), electron energy loss spectroscopy (EELS), and energy dispersive spectroscopy (EDS) techniques.

Figure 11:
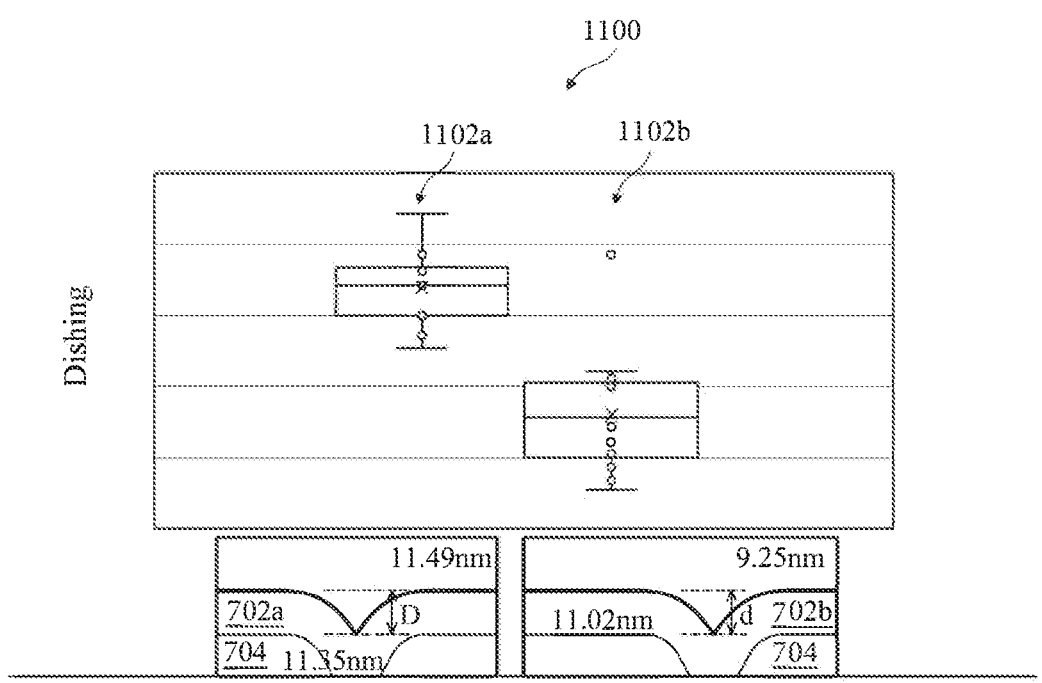
FIGS. 11 and 12 are distribution plots of measurement data for seam-top treatments applied to dielectric films, in accordance with some embodiments of the present disclosure.

FIG. 11 is a distribution plot 1100 that shows, along the Y-axis, dishing measurement data sets 1102a and 1102b after applying two different aspects of seam-sealing method 600 to dielectrics e.g., dielectric materials 702a and 702b, deposited using ALD onto an uneven substrate, e.g., substrate 704. Data set 1102b, on the right side, corresponds to a dielectric material 702b of thickness 11.02 nm that received a 30-second nitrogen pre-treatment 800 (at operation 604) using a source of nitrogen radicals, e.g., N2, while a dielectric material of comparable thickness, 11.35 nm, corresponding to data set 1102a on the left side, did not receive nitrogen pre-treatment 800. In these samples, the mean seam depth decreased by about 2.25 nm, from a depth D in the untreated dielectric film 702a, to a depth d for the pre-treated dielectric film 702b. This represents a seam depth reduction of about 20%, attributable to nitrogen pre-treatment 800, where the nitrogen was in the form of N2.

Figure 12:
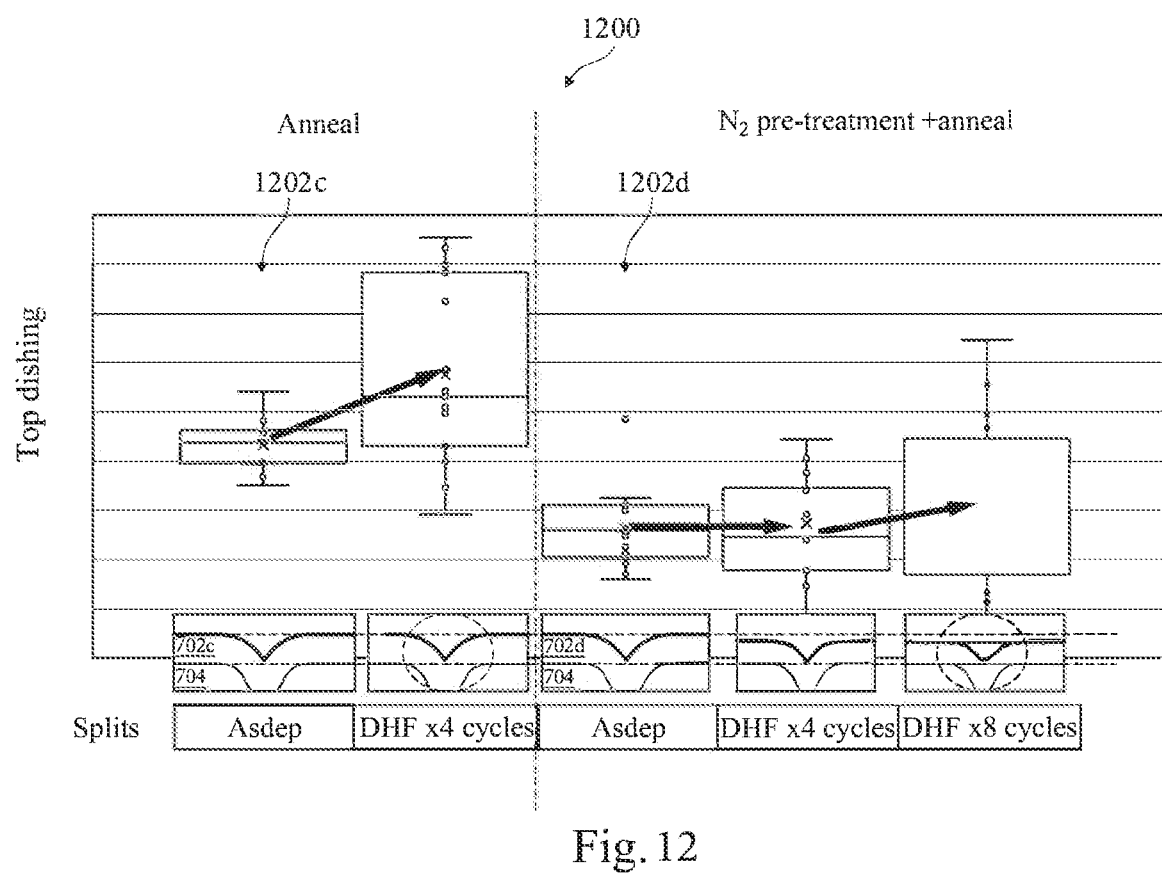

FIG. 12 is a distribution plot 1200 showing the effect on a subsequent wet etching operation, of applying two different aspects of seam-sealing method 600, in accordance with some embodiments of the present disclosure. FIG. 12 shows, along the Y-axis, data sets 1202c and 1202d of dishing measurements at top surface 710 of dielectric materials 702c and 702d deposited onto an uneven substrate 704. In some embodiments of the present disclosure, dishing can be measured using transmission electron microscopy (TEM). The left side plot in FIG. 12 (data set 1202c [902c]) shows (1) a measured amount of dishing in an as-deposited dielectric material 702c treated with the anneal of operation 210, and (2) additional dishing after a subsequent four-cycle wet etching operation. The arrow indicates a transition from after-deposition to after-wet etch. Dishing increased about 11% after processing for four 60-second cycles in a dilute hydrofluoric acid (DHF) bath with about 500:1 dilution. The right side plot in FIG. 12 (data set 1202d [902d]) shows (1) a measured amount of dishing in an as-deposited dielectric material 702d treated with both nitrogen pre-treatment 600 and the anneal of operation 210; (2) additional dishing after a first subsequent wet etching operation including four DHF cycles; and (3) additional dishing after a second subsequent wet etching operation including four more DHF cycles, for a total of eight DHF cycles. The arrow indicates a transition from after-deposition to after-four-cycle wet etch, and finally after-8-cycle wet etch. The dishing after four DHF cycles increased about 1%, and the dishing after eight DHF cycles increased by a total of about 5%. This represents about a 2× improvement in etch selectivity that can be attributed to nitrogen pre-treatment 800.

Figure 13B:
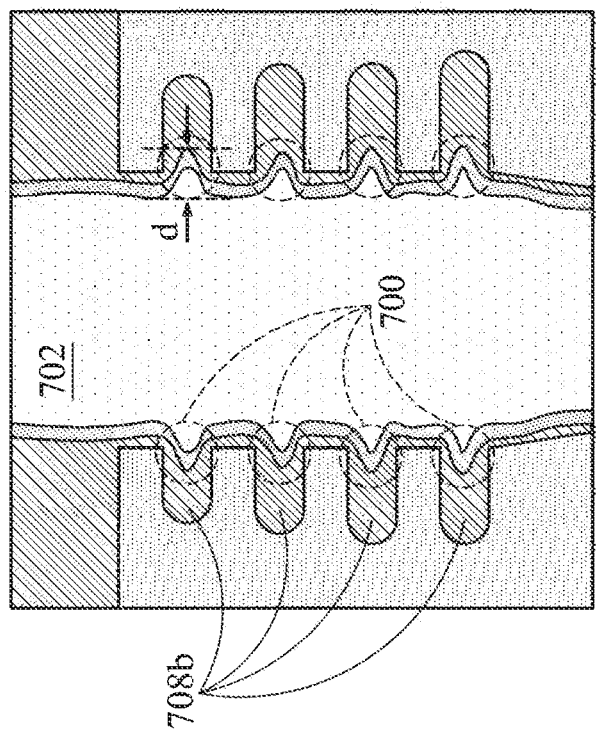
FIGS. 13A, 13B, 14A, 14B, and 15 are cross-sectional views showing effects of seam-top treatments, in accordance with some embodiments of the present disclosure.
Figure 13A:
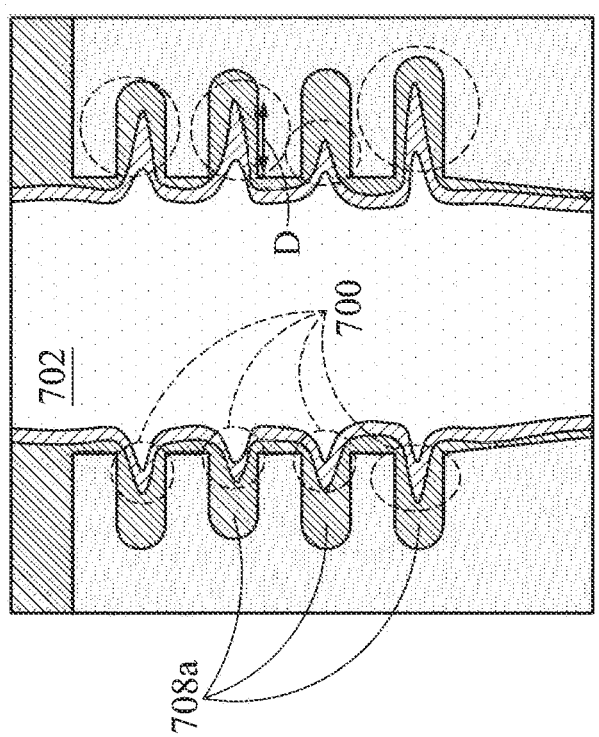

FIGS. 13A and 13B illustrate an example of the effect on wet etch profiles of applying seam-sealing method 600, in accordance with some embodiments of the present disclosure. Finger structures 708a and 708b shown in FIGS. 13A and 13B, respectively, include lateral fingers (e.g., inner spacers in a GAAFET) into which low-k dielectric material 702 is deposited by, for example, an ALD process. Both structures in FIG. 13A and FIG. 13B have received oxygen-conversion treatment 802 at operation 606. The structure shown in FIG. 13B also received a thermal N2 treatment at about 600° C. for about 1 hour, while the structure shown in FIG. 13A did not receive an annealing treatment. The thermal N2 treatment is one step in anneal operation 210 described above with respect to FIG. 2. Following an about three-minute dip in DHF with dilution about 500:1, severe dishing is evident in FIG. 13A. Seams 700, indicated by dashed circles in FIG. 13A penetrate into finger structures 708a by a distance D that ranges from about 1.5 nm to about 3.6 nm. However, dishing is considerably reduced in FIG. 13B following the N2 thermal treatment. After the about 500:1 DHF dip, finger structures 708b in FIG. 13B have substantially uniform seams 700 of length d, measured at about 1.5 nm. Thus, wet etch selectivity is improved by about 50% in finger structures 708b shown in FIG. 13B, attributable to the N2 thermal treatment.

Figure 14A:
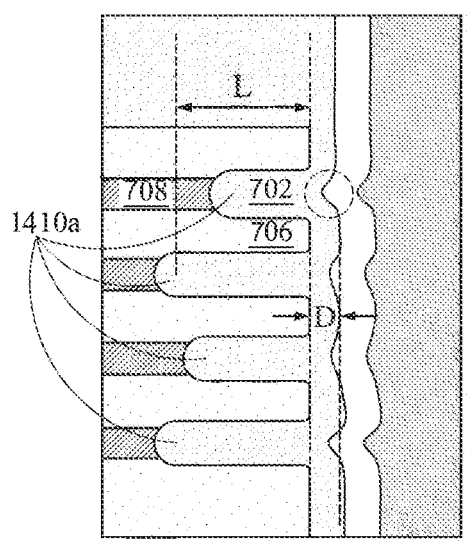
Figure 14B:
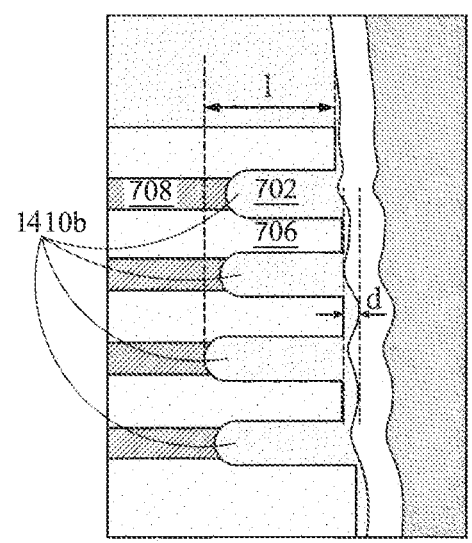

FIGS. 14A and 14B illustrate another example of the effect on wet etch profiles of applying seam-sealing method 600, in accordance with some embodiments of the present disclosure. Finger structures 1410 shown in FIGS. 14A and 14B are part of a test structure that can be used to simulate structures, such as inner spacers in a GAAFET, into which low-k dielectric material 702 is deposited by, for example, an ALD process. The structure in FIG. 14B received oxygen-conversion treatment 802 at operation 606 followed by the O2 thermal treatment component of annealing operation 610, in a Stand-Alone Plasma (SPA) reactor at about 400° C. for about 60 seconds. The control structure shown in FIG. 14A did not receive either O2 treatment. Following an about 185 s dip in DHF with dilution about 200:1, severe dishing is evident in FIG. 14A, with significant variation in dishing among fingers structure 1410a. Seams in FIG. 14A penetrate into finger structures 1410a by a distance L that averages about 1.9 nm. However, dishing is considerably reduced in FIG. 14B following both of the O2 treatments. After the about 200:1 DHF dip, finger structures 1410b in FIG. 14B have substantially uniform seams of length 1, measured at about 0.77 nm. Thus, wet etch selectivity is improved by about 60% in the finger structures shown in FIG. 14B, attributable to the O2 conversion and anneal operations. In addition, the remaining sidewall thickness, D, is about 2.3 times greater in the untreated structure shown in FIG. 14A, than the sidewall thickness, d, in the O2-treated structure shown in FIG. 14B. The DHF dip may reduce the sidewall thickness while improving the dishing.

Figure 15:
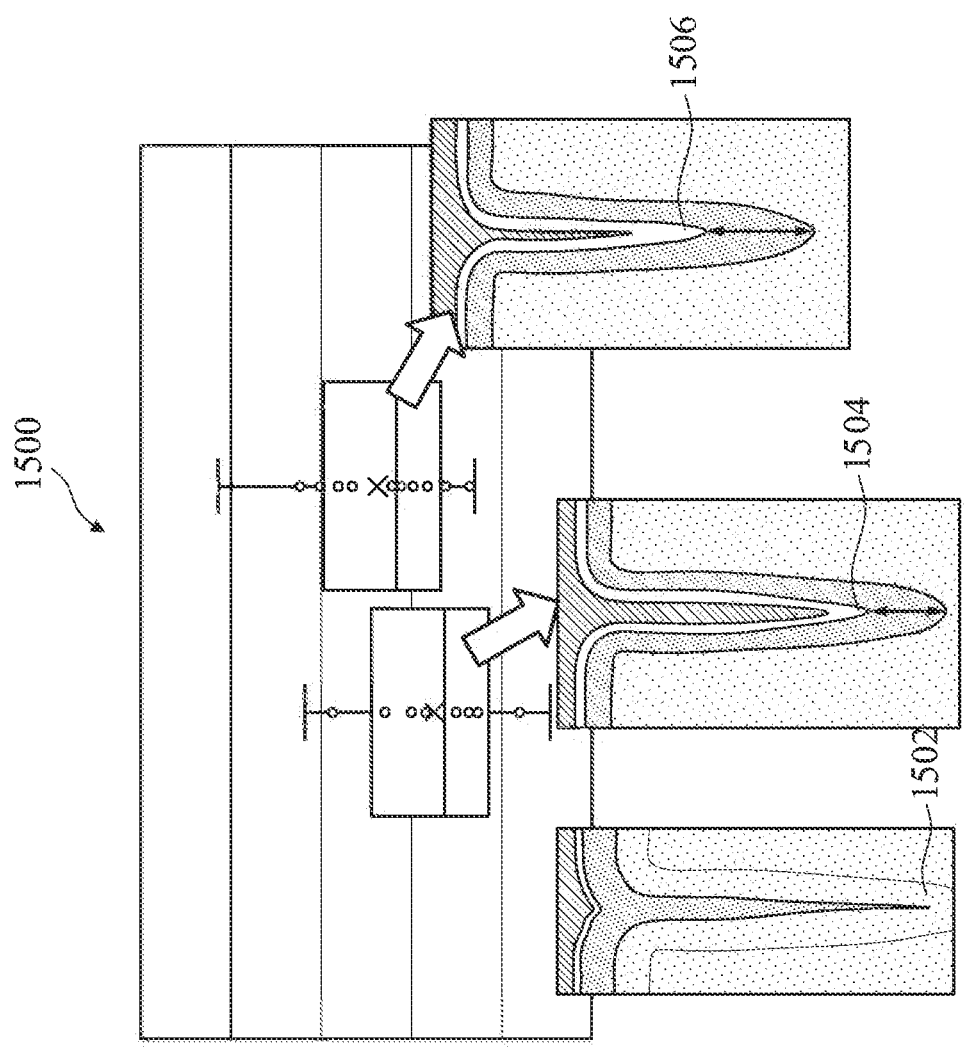

FIG. 15 shows a distribution plot 1500 comparing the effect of the annealing treatment at operation 610 with that of seam-sealing method 600 on the depth of ALD seams in a silicon nitride (SiN) dielectric, in accordance with some embodiments of the present disclosure. Cross-section micrographs are provided for comparison of seam depths. Seam 1502 is formed in SiN, as-deposited by ALD. Seam 1504 is partially merged by the annealing treatment at operation 610, thereby reducing the depth of the seam. Seam 1506 is merged by the annealing treatment at operation 610 and also sealed by the seam-sealing treatment as described above with respect to seam-sealing method 600. In this example, the depth of seam 1506 is reduced by an additional 4 nm compared with seam 1504. Another way of expressing this change is that the distribution of bottom-up heights increased by 4 nm, with application of the seam-sealing treatment.

Figure 16A:
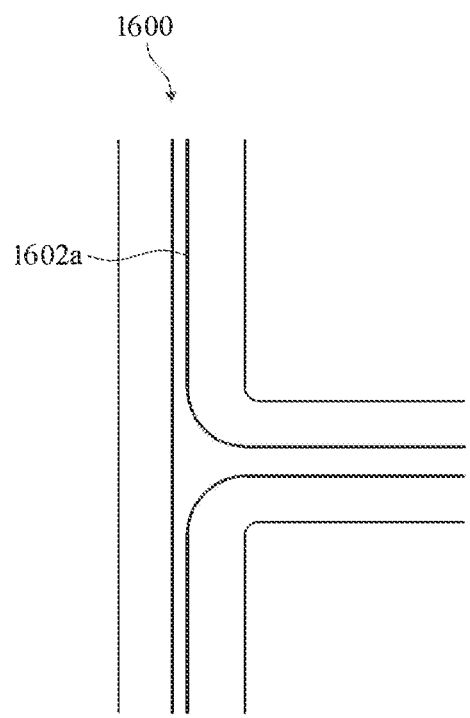
FIGS. 16A and 16B are top plan views of seam-top treatments applied to a T-shaped pattern, in accordance with some embodiments of the present disclosure.
Figure 16B:
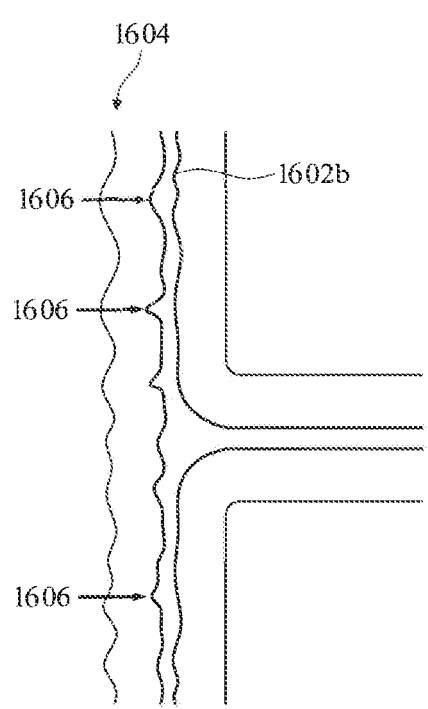

FIGS. 16A and 16B show an application of seam top sealing applied to a T-shaped structure, in accordance with some embodiments of the present disclosure. FIG. 16A shows a top plan view of a T-shaped structure 1600 formed by an ALD-deposited dielectric material, e.g., SiCN.

T-shaped structure 1600, as-deposited, exhibits a seam 1602a along a central axis of T-shaped structure 1600. In the event that the T-shape pattern is compromised such that one of the walls is not straight, but instead exhibits wiggles 1604 as shown in FIG. 16B, wiggles 1604 can cause ALD seam merge loss, producing a seam 1602b having points 1606. In addition, the ends of seam 1602b can exhibit voids. By applying seam-sealing method 600, treatment of seam 1602b can reduce points 1606 by about 1 nm. Sealing the seams in T-shaped structure 1600 using the techniques described herein may also reduce the probability of seam end voids.

Each of the examples shown and described with respect to FIGS. 8-13B demonstrates the effectiveness of method 600 in sealing top seams in ALD-deposited dielectric films. In each instance, the top seams are shown to be more resistant to etching after they are sealed or even partially sealed, which provides substantially uniform etching of dielectric films covering uneven topography.

In some embodiments of the present disclosure, a method includes: depositing, onto a semiconductor substrate, a dielectric layer having a surface structure that includes methanide ($CH_3$) radicals bonded to silicon atoms; applying a conversion treatment to convert the $CH_3$ radicals to hydroxide (OH) radicals; applying a dehydration treatment to remove water molecules from the surface structure; and cross-linking remaining oxygen atoms between adjacent silicon atoms.

In some embodiments of the present disclosure, a method includes: depositing, onto a substrate, a low-k dielectric layer using atomic layer deposition; applying a post-deposition treatment to the low-k dielectric layer, the post-deposition treatment including: converting methanide ($CH_3$) radicals at a top surface of the low-k dielectric layer to amino ($NH_2$) radicals; and converting the $NH_2$ radicals to hydroxide (OH) radicals; and annealing the treated low-k dielectric layer.

In some embodiments of the present disclosure, a structure includes: a semiconductor substrate; a gate-all-around field effect transistor (GAAFET) structure on the semiconductor substrate, the GAAFET structure comprising: source/drain regions; nanostructured channels between the source/drain regions; and a gate structure that wraps around the nanostructured channels; and spacers adjacent to the gate structure, the spacers made of a dielectric material having a surface layer in which silicon and oxygen atoms are cross-linked.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
depositing, onto a semiconductor substrate, a dielectric layer having a surface structure comprising methanide ($CH_3$) radicals bonded to silicon atoms;
applying a pre-treatment to convert the $CH_3$ radicals to amino ($NH_2$) radicals;
applying a conversion treatment to convert the $NH_2$ radicals to hydroxide (OH) radicals;
applying a dehydration treatment to remove water molecules from the surface structure; and
cross-linking remaining oxygen atoms between adjacent silicon atoms.

2. The method of claim 1, wherein depositing the dielectric layer comprises depositing a dielectric layer as an inner spacer of a gate-all-around field effect transistor (GAAFET).

3. The method of claim 1, wherein depositing the dielectric layer comprises depositing a low-k dielectric layer.

4. The method of claim 1, wherein depositing the dielectric layer comprises forming the dielectric layer by atomic layer deposition (ALD).

5. The method of claim 1, wherein depositing the dielectric layer comprises conforming the dielectric layer to a topography of an underlying layer.

6. The method of claim 1, wherein depositing the dielectric layer comprises depositing one or more of silicon oxycarbonitride, hydrogenated silicon oxycarbide, and hydrogenated silicon carbonitride.

7. The method of claim 1, wherein cross-linking comprises applying one or more of an ultra-violet (UV) cure and a wet anneal to the silicon atoms.

8. The method of claim 1, wherein applying the conversion and dehydration treatments comprises applying the conversion and dehydration treatments to a surface of the dielectric layer having a depth of about 1 nm to about 20 nm.

9. A method, comprising:
depositing, onto a substrate, a low-k dielectric layer using atomic layer deposition;
applying a post-deposition treatment to the low-k dielectric layer, the post-deposition treatment comprising:
converting methanide ($CH_3$) radicals at a top surface of the low-k dielectric layer to amino ($NH_2$) radicals; and
converting the $NH_2$ radicals to hydroxide (OH) radicals; and
annealing the treated low-k dielectric layer.

10. The method of claim 9, further comprising:
forming fins and isolation regions on the substrate;
forming a superlattice on the fins;
forming a sacrificial polysilicon gate on the superlattice;
etching back the superlattice in source/drain regions;
forming doped epitaxial source/drain regions;
removing doped layers from the superlattice;
forming an inter-layer dielectric; and
replacing the polysilicon gate with a gate-all-around structure that includes dielectric inner spacers.

11. The method of claim 9, wherein applying the post-deposition treatment comprises exposing the low-k dielectric layer to one or more of a nitrogen source, a hydrogen source, and an oxygen source comprising one or more of an oxygen plasma, oxygen gas, ozone, and water.

12. The method of claim 11, wherein exposing the low-k dielectric layer to the nitrogen source comprises exposing the low-k dielectric layer to one or more of a nitrogen plasma, nitrogen gas, ammonia ($NH_3$) gas, and nitrous oxide ($N_2O$) plasma.

13. The method of claim 11, wherein exposing the low-k dielectric layer to the hydrogen source comprises exposing the low-k dielectric layer to one or more of a hydrogen plasma and hydrogen gas.

14. The method of claim 9, wherein applying the post-deposition treatment comprises exposing the low-k dielectric layer to a microwave plasma.

15. The method of claim 9, wherein applying the post-deposition treatment comprises applying the post-deposition treatment at temperatures within a range of about 150° C. to about 300° C.

16. The method of claim 9, wherein applying the post-deposition treatment comprises applying the post-deposition treatment at pressures within a range of about 1 mTorr to about 2000 Torr.

17. The method of claim 9, further comprising applying a wet etch treatment to recess the low-k dielectric layer.

18. A method, comprising:
    forming a plurality of alternating first and second nanostructured layers on a substrate;
    etching an edge portion of each of the first nanostructured layers to form spacer cavities;
    depositing within the spacer cavities, a dielectric material having a surface comprising methanide ($CH_3$) radicals bonded to silicon atoms and amino ($NH_2$) radicals bonded to silicon atoms; and
    converting the $CH_3$ radicals and $NH_2$ radicals on the dielectric material surface to hydroxide (OH) radicals.

19. The method of claim 18, further comprising removing OH radicals bonded to silicon atoms on the dielectric material surface by a dehydration and cross-linking process.

20. The method of claim 19, wherein the dehydration and cross-linking process comprises exposing the dielectric material to ultra-violet light.

* * * * *